United States Patent
Parikh et al.

(10) Patent No.: US 9,330,424 B2
(45) Date of Patent: May 3, 2016

(54) POWER MANAGEMENT ANALYSIS AND MODELING FOR DISTRIBUTED COMPUTER SYSTEMS

(71) Applicant: VMware, Inc., Palo Alto, CA (US)

(72) Inventors: Aashish Parikh, Santa Clara, CA (US); Rohit Bhoj, Sunnyvale, CA (US); Pradeep Padala, Sunnyvale, CA (US); Mustafa Uysal, Fremont, CA (US); Anne Holler, Los Altos, CA (US)

(73) Assignee: VMware, Inc., Palo Alto, CA (US)

( * ) Notice: Subject to any disclaimer, the term of this patent is extended or adjusted under 35 U.S.C. 154(b) by 496 days.

(21) Appl. No.: 13/931,787

(22) Filed: Jun. 28, 2013

(65) Prior Publication Data

US 2015/0006140 A1    Jan. 1, 2015

(51) Int. Cl.
*G06F 17/50* (2006.01)
*G06Q 50/06* (2012.01)
*G06Q 10/06* (2012.01)
*G06F 21/00* (2013.01)

(52) U.S. Cl.
CPC ............ *G06Q 50/06* (2013.01); *G06Q 10/06* (2013.01); *G06F 17/5009* (2013.01)

(58) Field of Classification Search
USPC .......... 703/2, 13, 18; 716/109, 113; 713/310, 713/320
See application file for complete search history.

(56) References Cited

U.S. PATENT DOCUMENTS

| | | | | |
|---|---|---|---|---|
| 7,313,510 | B2* | 12/2007 | Karunaratne | G06F 17/5022 703/13 |
| 7,506,292 | B2* | 3/2009 | Sarwary | H04L 7/0012 716/113 |
| 7,549,069 | B2* | 6/2009 | Ishihara | G06F 17/5022 703/13 |
| 8,829,721 | B2* | 9/2014 | Egiziano | G05F 1/67 307/82 |
| 2004/0243376 | A1* | 12/2004 | Karunaratne | G06F 17/5022 703/18 |
| 2007/0220292 | A1* | 9/2007 | Ishihara | G06F 17/5022 713/320 |
| 2008/0091402 | A1* | 4/2008 | Karunaratne | G06F 17/5022 703/14 |
| 2011/0218791 | A1* | 9/2011 | Lee | G06G 7/62 703/16 |
| 2013/0212546 | A1* | 8/2013 | Chen | G06F 17/5045 716/109 |

OTHER PUBLICATIONS

Gulati et al.; "VMware Distributed Resource Management: Design, Implementation, and Lessons Learned"; VMware Technical Journal vol. 1, No 1; Apr. 2012.

* cited by examiner

*Primary Examiner* — Thai Phan

(57) ABSTRACT

A system and method for performing a hypothetical power management analysis on a distributed computer system uses chronologically consecutive snapshots of the distributed computer system. The snapshots are used to extract demands of clients running in the distributed computer system for a resource for different time intervals, which are then stitched together to produce a workload trace. The snapshots and the workload trace are used to construct modeling scenarios for the distributed computer system. The modeling scenarios are used to perform analyzes to simulate the operation of the distributed computer system during which the power management module is enabled to compute potential power savings.

30 Claims, 7 Drawing Sheets

POWER MANAGEMENT ANALYSIS AND MODELING FOR DISTRIBUTED COMPUTER SYSTEMS

BACKGROUND

Sharing resources in networked computer systems, such as processors, computer memories, network bandwidth and data storage facilities, can increase efficiency by reducing maintenance and operating costs, allowing flexibility with respect to individual resource usage, and simplifying resource management. With respect to shared storage, the benefits include data consolidation, universal access to data, ease of storage management, and support for live migration of virtualized environments.

A set of hardware computing platforms can be organized as a server cluster to provide computing resources for resource sharing. These server clusters can be organized into one or more data centers that can support multiple virtual machines (VMs) for various operations. For each data center, a resource allocation tool is typically used to monitor resource usage by the VMs in the data center and to dynamically allocate resources to the VMs during operation for various reasons, such as load balancing and increased/decreased workload. In addition, a power management tool can be used to power down and power up servers as needed to significantly increase power and cost savings for the data center.

SUMMARY

A system and method for performing a hypothetical power management analysis on a distributed computer system uses chronologically consecutive snapshots of the distributed computer system. The snapshots are used to extract demands of clients running in the distributed computer system for a resource for different time intervals, which are then stitched together to produce a workload trace. The snapshots and the workload trace are used to construct modeling scenarios for the distributed computer system. The modeling scenarios are used to perform analyses to simulate the operation of the distributed computer system during which the power management module is enabled to compute potential power savings.

A method for performing a hypothetical power management analysis on a distributed computer system in accordance with an embodiment of the invention includes (1) receiving a plurality of chronologically consecutive snapshots of the distributed computer system for a predefined time period during which a power management module may be disabled, each snapshot containing information regarding at least resource usage of clients running in the distributed computer system during a specified time interval of the predefined time period, (2) extracting demands of the clients for a resource from each snapshot of the distributed computer system, (3) stitching together the extracted demands of the clients for the resource from the chronologically consecutive snapshots to produce a workload trace for the predefined time period, (4) constructing modeling scenarios from the chronologically consecutive snapshots of the distributed computer system and the workload trace, and (5) performing analyses on the modeling scenarios to simulate the operation of the distributed computer system for the predefined time period during which the power management module is enabled to compute potential power savings. In some embodiments, the steps of this method are performed, when program instructions contained in a computer-readable storage medium is executed by one or more processors.

A computer system in accordance with an embodiment of the invention includes at least one processor, and a power management analysis module operably connected to the at least one processor. The power management analysis module includes an access interface unit, a resource demand extracting unit, a stitching unit, and a power management simulator. The access interface unit is configured to receive a plurality of chronologically consecutive snapshots of the distributed computer system for a predefined time period during which a power management module may be disabled. Each snapshot contains information regarding at least resource usage of clients running in the distributed computer system during a specified time interval of the predefined time period. The resource demand extracting unit is configured to extract demands of the clients for a resource from each snapshot of the distributed computer system. The stitching unit is configured to stitch together the extracted demands of the clients for the resource from the chronologically consecutive snapshots to produce a workload trace for the predefined time period. The power management simulator is configured to construct modeling scenarios from the chronologically consecutive snapshots of the distributed computer system and the workload trace, and to perform performing analyses on the modeling scenarios to simulate the operation of the distributed computer system for the predefined time period during which the power management module is enabled to compute to compute potential power savings.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
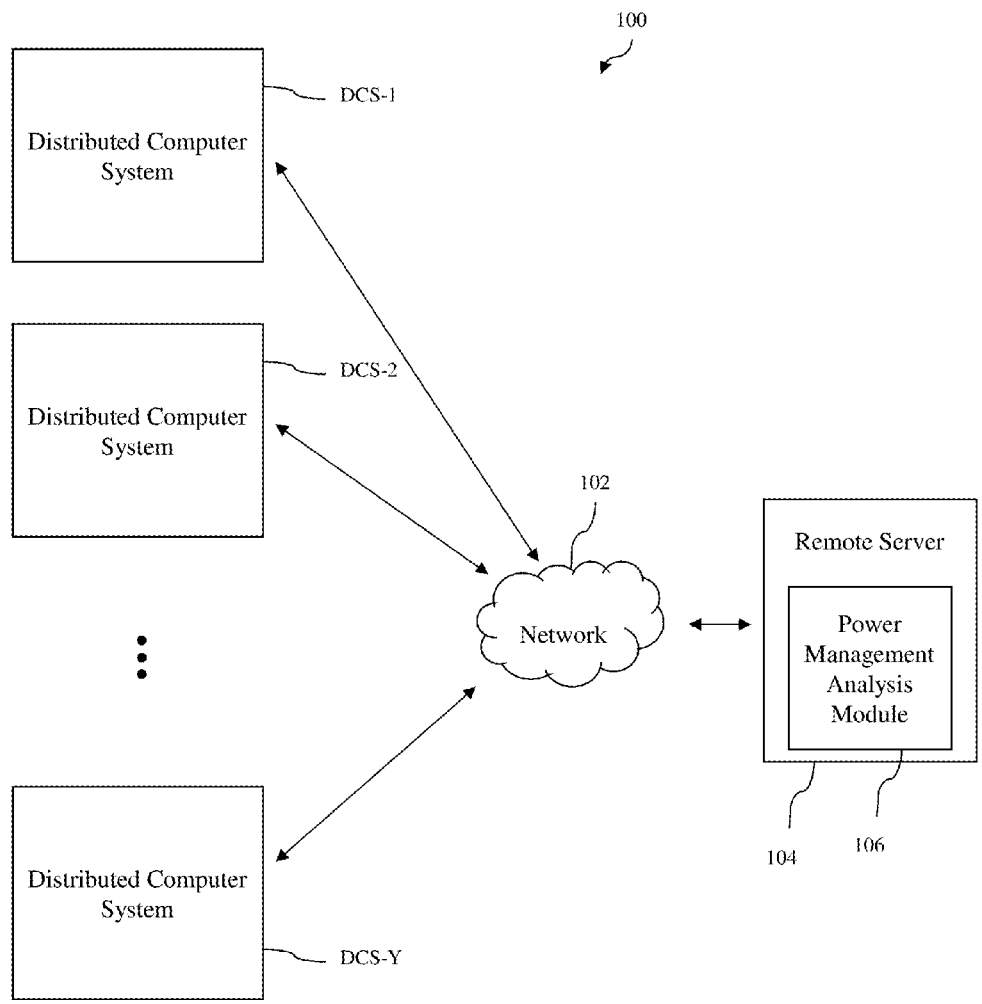
FIG. 1 is a block diagram of a computer network system in accordance with an embodiment of the invention.

Turning now to FIG. 1, a computer network system 100 in accordance with an embodiment of the invention is shown. As shown in FIG. 1, the computer network system includes a network 102, distributed computer systems DCS-1, DCS-2 . . . DCS-Y and a remote server 104 with a power management analysis module 106. The number of distributed computer systems included in the computer network system can be from few distributed computer systems to hundreds of distributed computer systems or more. The distributed computer systems and the remote server are connected to the network. Thus, the distributed computer systems are able to communicate with the remote server via the network.

The network 102 can be any type of computer network or a combination of networks that allows communications between devices connected to the network. The network 102 may include the Internet, a wide area network (WAN), a local area network (LAN), a storage area network (SAN), a fibre channel network and/or other networks. The network 102 may be configured to support protocols suited for communications with storage arrays, such as Fibre Channel, Internet Small Computer System Interface (iSCSI), Fibre Channel over Ethernet (FCoE) and HyperSCSI.

The distributed computer systems DCS-1, DCS-2 . . . DCS-Y are facilities with a collection of computers and storage devices. At least some of the distributed computer systems may be data centers, and thus, may include components and systems commonly found in data centers, such as backup power supplies and environmental control systems. Each of these distributed computer systems may be owned and operated by a different entity, e.g., a company.

Figure 2:
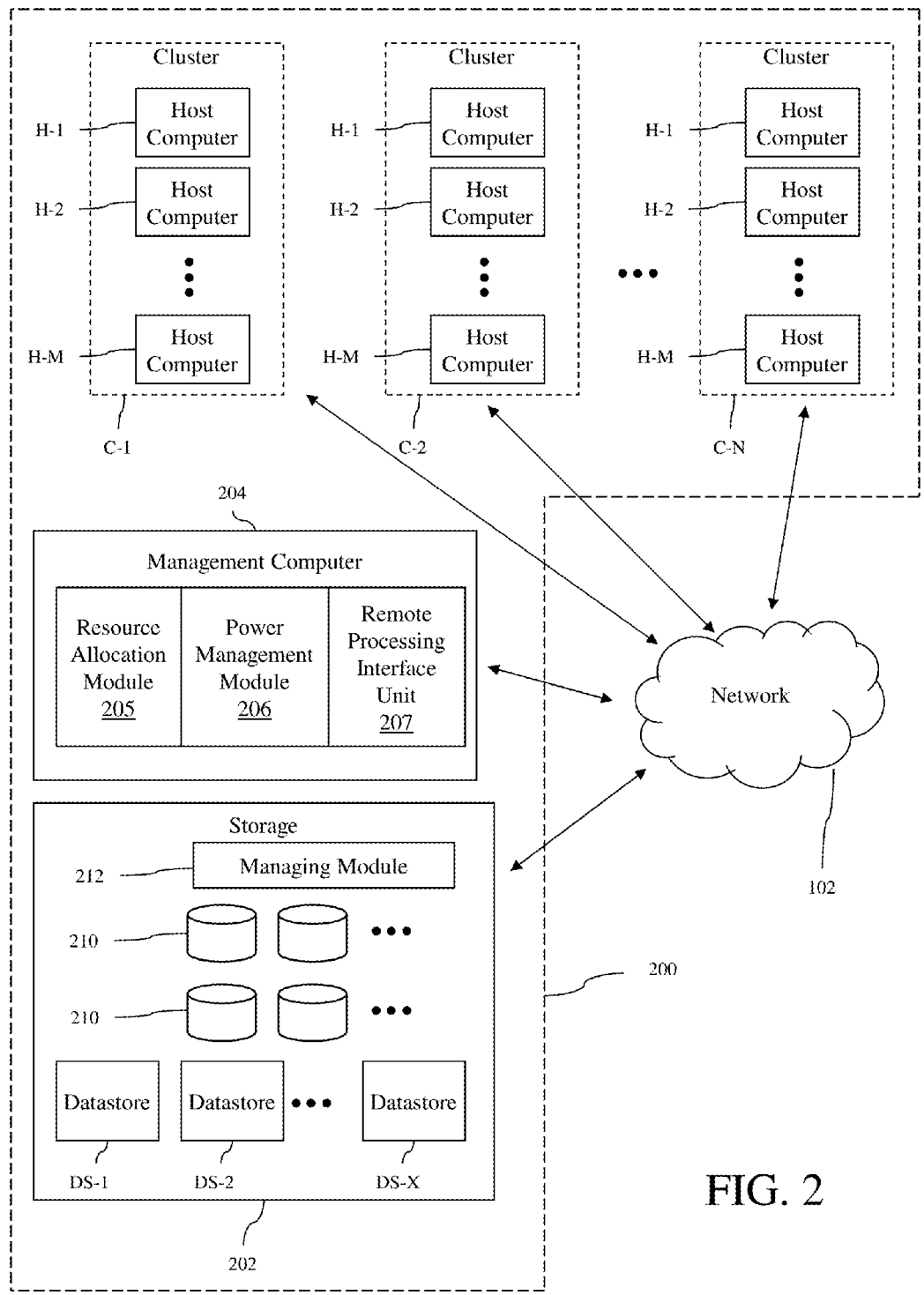
FIG. 2 is a block diagram of a representative distributed computer system 200 in accordance with an embodiment of the invention.

Turning now to FIG. 2, a representative distributed computer system 200 in accordance with an embodiment of the invention is shown. As shown in FIG. 2, the distributed computer system 200 includes clusters C-1, C-2 . . . C-N of host computers, storage 202 and a management computer 204 with a resource allocation module 205, a power management module 206 and a remote processing interface unit 207. The exact number of host computer clusters included in the distributed computer system can be any number of clusters from one cluster to tens of clusters or more. The host computers of the different clusters, the storage and the management computer are connected to the network 102. Thus, each of the host computers in the clusters and the management computer are able to access the storage via the network and may share the resources provided by the storage. Consequently, any process running on any of the host computers and the management computer may also access the storage via the network. Although not illustrated, the host computers of the different clusters, the storage and the management computer may be directly connected to each other.

In the illustrated embodiment, each of the clusters C-1, C-2 . . . C-N includes a number of host computers H-1, H-2 . . . H-M. The number of host computers included in each of the clusters can be any number from one to several hundred or more. In addition, the number of host computers included in each of the clusters can vary so that different clusters can have different number of host computers. The host computers are physical computer systems that host or support one or more clients so that the clients are executing on the physical computer systems. As used herein, the term "client" is any software entity that can run on a computer system, such as a software application, a software process or a virtual machine (VM). The host computers may be servers that are commonly found in data centers. As an example, the host computers may be servers installed in one or more server racks. Typically, the host computers of a cluster are located within the same server rack.

Figure 3:
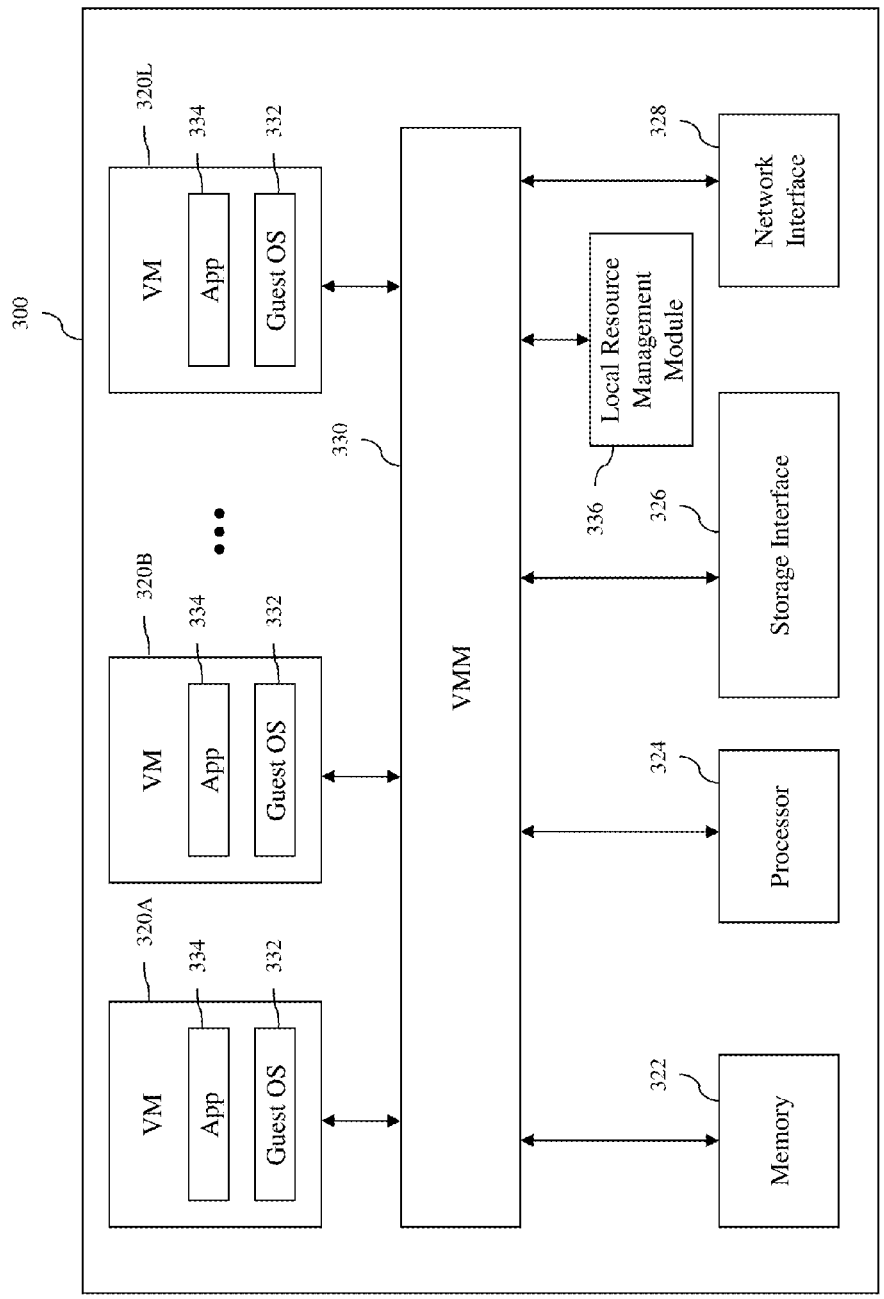
FIG. 3 is a block diagram of a representative host computer in accordance with an embodiment of the invention.

Turning now to FIG. 3, components of a host computer 300 that is representative of the host computers H-1, H-2 . . . H-M in the clusters C-1, C-2 . . . C-N in accordance with an embodiment of the invention are shown. In FIG. 3, the physical connections between the various components of the host computer are not illustrated. In the illustrated embodiment, the host computer is configured to support a number of clients 320A, 320B . . . 320L, which are VMs. The number of VMs supported by the host computer can be anywhere from one to more than one hundred. The exact number of VMs supported by the host computer is only limited by the physical resources of the host computer. The VMs share at least some of the hardware resources of the host computer, which include system memory 322, one or more processors 324, a storage interface 326, and a network interface 328. The system memory 322, which may be random access memory (RAM), is the primary memory of the host computer. The processor 324 can be any type of a processor, such as a central processing unit (CPU) commonly found in a server. The storage interface 326 is an interface that allows that host computer to communicate with the storage 202. As an example, the storage interface may be a host bus adapter or a network file system interface. The network interface 328 is an interface that allows the host computer to communicate with other devices connected to the network 102. As an example, the network interface may be a network adapter.

In the illustrated embodiment, the VMs 320A, 320B . . . 320L run on top of a virtual machine monitor 330, which is a software interface layer that enables sharing of the hardware resources of the host computer 300 by the VMs. However, in other embodiments, one or more of the VMs can be nested, i.e., a VM running in another VM. For example, one of the VMs may be running in a VM, which is also running in another VM. The virtual machine monitor may run on top of the host computer's operating system or directly on hardware of the host computer. In some embodiments, the virtual machine monitor runs on top of a hypervisor that is installed on top of the hardware components of the host computer. With the support of the virtual machine monitor, the VMs provide virtualized computer systems that give the appearance of being distinct from the host computer and from each other. Each VM includes a guest operating system 332 and one or more guest applications 334. The guest operating system is a master control program of the respective VM and, among other things, the guest operating system forms a software platform on top of which the guest applications run.

Similar to any other computer system connected to the network 102, the VMs 320A, 320B . . . 320L are able to communicate with other computer systems connected to the network using the network interface 328 of the host computer 300. In addition, the VMs are able to access the storage 202 using the storage interface 326 of the host computer.

The host computer 300 also includes a local resource management module 336 that operates as part of a resource management system for a distributed computer system that includes the host computer, such as a distributed resource scheduler system, to manage resources consumed by the VMs 320A, 320B . . . 320L. Although the local resource management module is illustrated in FIG. 3 as being separate from the virtual machine monitor 330, the local resource management module may be implemented as part of the virtual machine monitor. In some embodiments, the local resource management module is implemented as software programs running on the host computer. However, in other embodiments, the local resource management module may be implemented using any combination of software and hardware.

Turning back to FIG. 2, the storage 202 is used to store data for the host computers H-1, H-2 . . . H-M of the clusters C-1, C-2 . . . C-N, which can be accessed like any other storage device connected to computer systems. In an embodiment, the storage can be accessed by entities, such as clients running on the host computers, using any file system, e.g., virtual machine file system (VMFS) or network file system (NFS). The storage includes one or more computer data storage devices 210, which can be any type of storage devices, such as solid-state devices (SSDs), hard disks or a combination of the two. The storage devices may operate as components of a network-attached storage (NAS) and/or a storage area network (SAN). The storage includes a storage managing module 212, which manages the operation of the storage. In an embodiment, the storage managing module is a computer program executing on one or more computer systems (not shown) of the storage. The storage supports multiple datastores DS-1, DS-2 . . . DS-X, which may be identified using logical unit numbers (LUNs). In an embodiment, the datastores are virtualized representations of storage facilities. Thus, each datastore may use the storage resource from more than one storage device included in the storage. The datastores are used to store data associated with the clients supported by the host computers of the clusters. For virtual machines, the datastores may be used to store virtual storage, e.g., virtual disks, used by each of the virtual machines, as well as other files needed to support the virtual machines. One or more datastores may be associated with one or more host computers. Thus, each host computer is associated with at least one datastore. Some of the datastores may be grouped into one or more clusters of datastores, which are commonly referred to as storage pods.

The management computer 204 operates to monitor and manage the host computers H-1, H-2 . . . H-M of the clusters C-1, C-2 . . . C-N and/or the storage 202 of the distributed computer system 200. The management computer may be configured to monitor the current configurations of the host computers and the clients running on the host computers, for example, virtual machines (VMs). The monitored configurations may include hardware configuration of each of the host computers, such as CPU type and memory size, and/or software configurations of each of the host computers, such as operating system (OS) type and installed applications or software programs. The monitored configurations may also include clustering information, i.e., which host computers are included in which clusters. The monitored configurations may also include client hosting information, i.e., which clients, e.g., VMs, are hosted or running on which host computers. The monitored configurations may also include client information. The client information may include size of each of the clients, virtualized hardware configuration of each of the clients, such as virtual CPU type and virtual memory size, software configuration of each of the clients, such as OS type and installed applications or software programs running on each of the clients, and virtual storage size for each of the clients. The client information may also include resource settings, such as limit, reservation, entitlement and share values for various resources, e.g., CPU, memory, network bandwidth and storage, which are consumed by the clients.

The management computer 204 may also be configured to monitor the current configuration of the storage 20, including the physical storage devices 210 and the datastores DS-1, DS-2 . . . DS-X of the storage. The monitored storage configuration may include storage device configuration, which may include the number of storage devices in the storage, the device type of the storage devices, such as solid-state devices (SSDs) and hard disks, and storage capacity of each of the storage devices. The monitored storage configuration may also include datastore configuration, such as storage capacity of each of the datastores and connections and associations between the datastores and the host computers H-1, H-2 . . . H-M and/or the clients running on the host computers.

The management computer 204 may also be configured to monitor the current usage of resources by the clients, the host computers H-1, H-2 . . . H-M and the clusters C-1, C-2 . . . C-N of host computers. Thus, the management computer may monitor CPU processing usage, memory usage, network usage and storage usage of the clients. The management computer may also be configured to store the usage of resources by the clients, the host computers and the clusters of host computers to maintain historical resource usage information. The historical resource usage information can then be used to develop various resource usage statistics for the individual clients, the individual host computers and the individual clusters of host computers.

The management computer 204 may also be configured to perform various operations to manage the clients, the clusters C-1, C-2 . . . C-N of host computers H-1, H-2 . . . H-M and the storage 202. The management computer may be configured to initially place new clients onto one or more of the host computers in particular clusters and move existing clients to different host computers and/or different clusters. The management computer may also be configured to implement resource allocation recommendations made by the resource allocation module 205. The management computer may also be configured to power down particular clients and/or host computers to conserve power in response to recommendations made by the power management module 206. In order to perform these various operations, the management computer may maintain requirements and preferences for the clients with respect to the host computers and the datastores. These requirements and preferences may include affinity or anti-affinity rules for some of the clients, which may be mandatory or preferential. For example, these affinity or anti-affinity rules may include rules that specify which clients should run on the same host computer or be kept on separate host computers. As another example, these affinity or anti-affinity rules may include rules that specify which host computers are acceptable to clients and which host computers are not. The management computer may be configured or programmed to perform other operations to manage the distributed computer system 200. In an implementation, the management computer is a VMware vCenter™ server with at least some of the features available for such server.

The resource allocation module 205 of the management computer 204 operates to perform a resource allocation analysis of the distributed computer system 200 to make resource allocation recommendations on the distributed computer system, including any initial client placement and client relocation recommendations, using a current snapshot of the distributed computer system. The local resource allocation module may also provide various metrics related to resource allocation.

As used herein a snapshot of a distributed computer system contains at least configuration and resource usage information of the distributed computer system at a particular moment in time. The snapshot may include the current configurations of host computers and clients running on the host computers in the distributed computer system. These configurations of the host computer and the clients may include hardware and software configurations of each host computer, clustering information, client hosting information and client information, which were described above with respect to the management computer. The snapshot may also include the current configuration of storage in the distributed computer system, including the configurations of storage devices and datastores of the storage. In addition, the snapshot may also include various settings for the resource allocation module 205. The snapshot may also include resource usage information for various components of the distributed computer system, including historical resource usage information regarding the distributed computer system. Lastly, the snapshot may also include resource allocation statistics, such as how often a client has been moved to different host computers or how often a client has consumed the entire resource allotted to that client.

The resource allocation module 205 interfaces with other components of the management computer 204 to obtain the information needed to generate the snapshot. In other embodiments, the snapshot may be generated by one or more other components of the management computer. In an embodiment, the snapshot is a memory object, which is produced by dumping one or more memories of the management computer. The size of the snapshot can vary, but in a particular implementation, the size of the snapshot is not larger than twenty (20) Megabytes.

The power management module 206 of the management computer 204 operates to efficiently manage the electrical power consumed by the host computers H-1, H-2 . . . H-M in the distributed computer system 200. In particular, the power management module operates to consolidate clients, e.g., VMs, with low demands onto a smaller set of host computers. Consequently, some of the host computers can be put into standby mode, which will result in a smaller amount of power usage in one or more clusters. As workloads change and demand increases, the power management module will bring powered off host computers online and migrate clients onto the newly powered on host computers.

In an embodiment, the power management module 206 monitors resource demands and utilizations of clients, e.g., VMs, in a cluster. During periods of low resource utilization, the power management module internally evaluates its options by hypothetically putting various candidate host computers and various combinations of such candidate host computers into standby mode, evacuating their clients to other host computers. After performing these various internal what-if analyses, the power management module checks the end states of each of these analyses and tries to find the most optimal end state.

In order to find the most optimal end state, the power management module 206 eliminates any states that result in a violation of business rules, such as affinity or anti-affinity rules that may be set by the user (affinity and anti-affinity rules will be described below), or of implicit rules that may be set by other solutions, such as High Availability (HA), Fault Tolerance (FT), VMware Update Manager (VUM), etc. Next, the power management module evaluates all remaining states to check the values of several important metrics, such as VM happiness (i.e., whether resource demands of VMs are being met) and the cluster imbalance metric. The power management module aims to maximize the VM happiness and minimize the cluster imbalance metric. Various other constraints and preferences that are set by the user can be used to filter the pruned set of values and the best of these values is declared the target state. The power management module then issues a set of recommendations to convert the current state into the target state.

The power management module 206 may include a rich set of advance options that may be tuned for ideal performance in individual deployments. The following table lists a few of these advance options that are tunable and can cause the power management module to use different levels of aggressiveness when performing power management analyses.

| Option | Legal Values | Default Value |
|---|---|---|
| DemandCapacityRatioTarget<br>This is the utilization target for each host computer; The power management module will try to make sure that each host computer has a mean target utilization of 60% in the default case. | 40-100 | 60 |
| DemandCapacityRatioToleranceHost<br>Tolerance around the utilization target for each host computer; in the default case, the power management module will attempt to keep the utilization of each host computer in the range 60 ± 10%. | 10%-40% | 10% |
| PowerStarThreshold<br>The star threshold used to consider consolidating/load balancing moves and to control the power management module aggressiveness; by default, the power management module will make moves of rating 3 and above. If this number is set to 1, the power management module will become very aggressive. | 1-5 | 3 |

In an embodiment, the power management module 206 may be part of the resource allocation module 205. As an example, the resource allocation module may be a Distributed Resource Schedule (DRS) provided by VMware Inc., and the power management module may be a feature, known as Distributed Power Management (DPM), in the DRS that can be enabled by the user. In this embodiment, some of the operations described above with respect to power management may be performed by the resource allocation module. Both the resource allocation module and the power management module use snapshots of the distributed computer system to perform their tasks. A single snapshot may be created each time the resource allocation module is invoked, for example, every 5 minutes.

The remote processing interface unit 207 of the management computer 204 allows a user to interface with the remote server 104 so that the remote server can perform a hypothetical power management analysis to show the user the benefits of using or enabling the power management module 206, as described in more detail below. In particular, the remote processing interface unit allows the user to connect to the remote server, e.g., using a login process, and submit chronologically consecutive snapshots of the distributed computer system 200 for a specified period of time, e.g., a day, a week or a month, that were captured during the operation of the resource allocation module 205 for hypothetical power management analysis on the distributed computer system. The results of the hypothetical power management analysis can then be received from the remote server via the remote processing interface unit and presented to the user in some appropriate format, such as graphics and/or text displayed on a computer monitor.

Turning back to FIG. 1, in the illustrated embodiment, the power management analysis module 106 is located in the remote server 104, which can be any type of computer with one or more processors, memory and other components commonly found in a computer system. The remote server is physically located outside of the distributed computer systems DCS-1, DCS-2 . . . DCS-Y, and thus, is not part of any of the distributed computer systems. In other embodiments, the power management analysis module may be located in another computer or distributed among multiple computers, which are located outside of the distributed computer systems, and may be part of a cloud computing infrastructure. Components of the power management analysis module in accordance with an embodiment of the invention are illustrated in FIG. 4.

Figure 4:
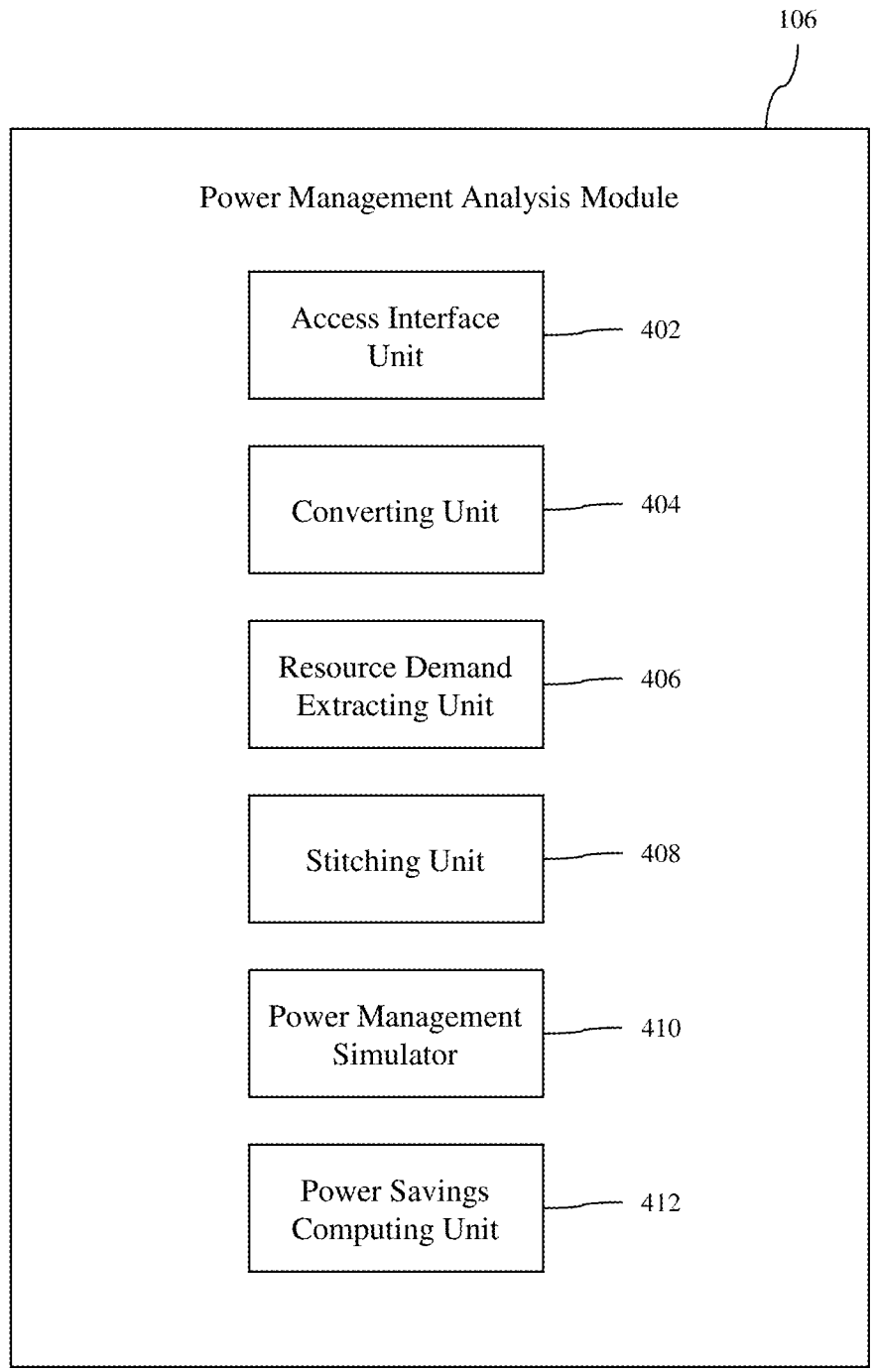
FIG. 4 is a block diagram of a power management analysis module in the computer network system in accordance with an embodiment of the invention.

As shown in FIG. 4, the power management analysis module 106 includes an access interface unit 402, a converting unit 404, a resource demand extracting unit 406, a stitching unit 408, a power management simulator 410 and a power savings computing unit 412. These components of the power management analysis module can be implemented as software, hardware or a combination of software and hardware. In one implementation, these components of the power management analysis module are part of a program executed by one or more processors of the remote server 104.

The access interface unit 402 operates to interface with the management computers in the different distributed computer systems DCS-1, DCS-2 . . . DCS-Y. In particular, the access interface unit communicates with the remote processing interface units running in the management computers to receive snapshots of the distributed computer systems for power management analyses and to send results of the power management analyses back to the management computers via the remote processing interface units. In an embodiment, the received snapshots are chronologically consecutive snapshots of a distributed computer system for a predefined time period, such as a day, a week or a month, during which a power management module of the distributed computer system may or may not be disabled.

The converting unit 404 operates to read chronologically consecutive snapshots of a distributed computer system, where each snapshot may be a separate file, and for each snapshot, converts the snapshot into an algorithm object that can be used to represent the inventory, configuration and statistical resource information in the distributed computer system. In an embodiment, each snapshot is a dump file of a resource allocation module, and the algorithm object is configured to be used by a resource allocation module to represent the inventory, configuration and resource statistical information in the distributed computer system.

Figure 5:
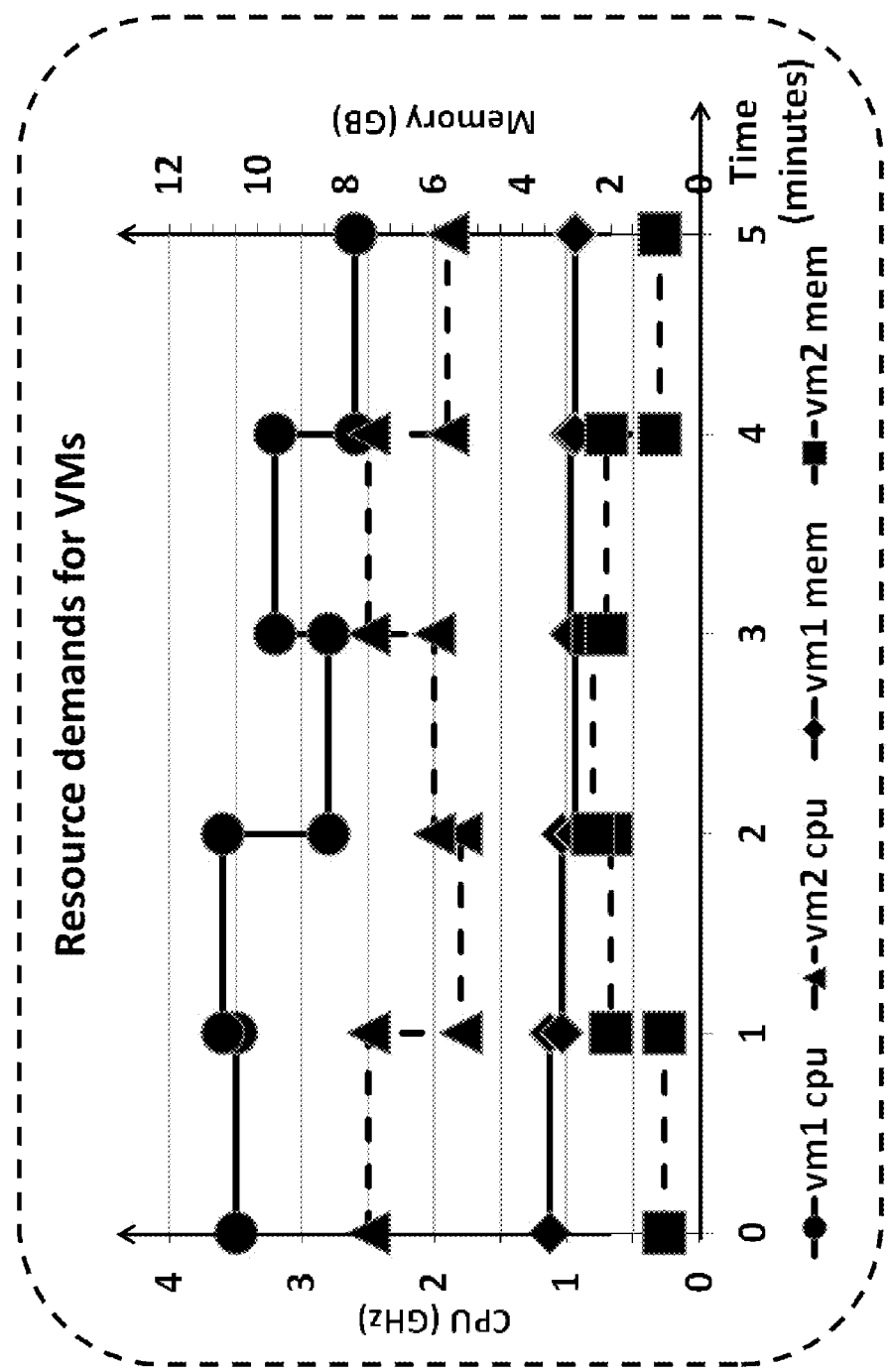
FIG. 5 shows a simplified view of resource demands for two virtual machines extracted from a single snapshot file for a five minute interval.

The resource demand extracting unit 406 operates to extract resource demand data for each client, e.g., VM, in the distributed computer system from the algorithm objects. As an example, the resource demand extracting unit may extract CPU and memory demand data for each VM in the distributed computer system from the algorithm objects. Since each algorithm object includes the inventory, configuration and resource statistical information in the distributed computer system, the resource demands for each client in the distributed computer system can be readily determined from the algorithm objects. In an embodiment, the snapshots contain averages of resource active values for a specified time interval, e.g., one minute, that can be each expressed as constant functions whose duration is the specified time interval. These averages of resource active values can then be used to determine resource demands. FIG. 5 shows a simplified view of resource demands for two VMs extracted from a single snapshot file for a five minute interval. In this example, VM1 and VM2 have CPU demands ranging from approximately 1.8 GHz to 2.6 GHz, and have memory demands ranging from approximately 512 MB to 3.5 MB.

Figure 6:
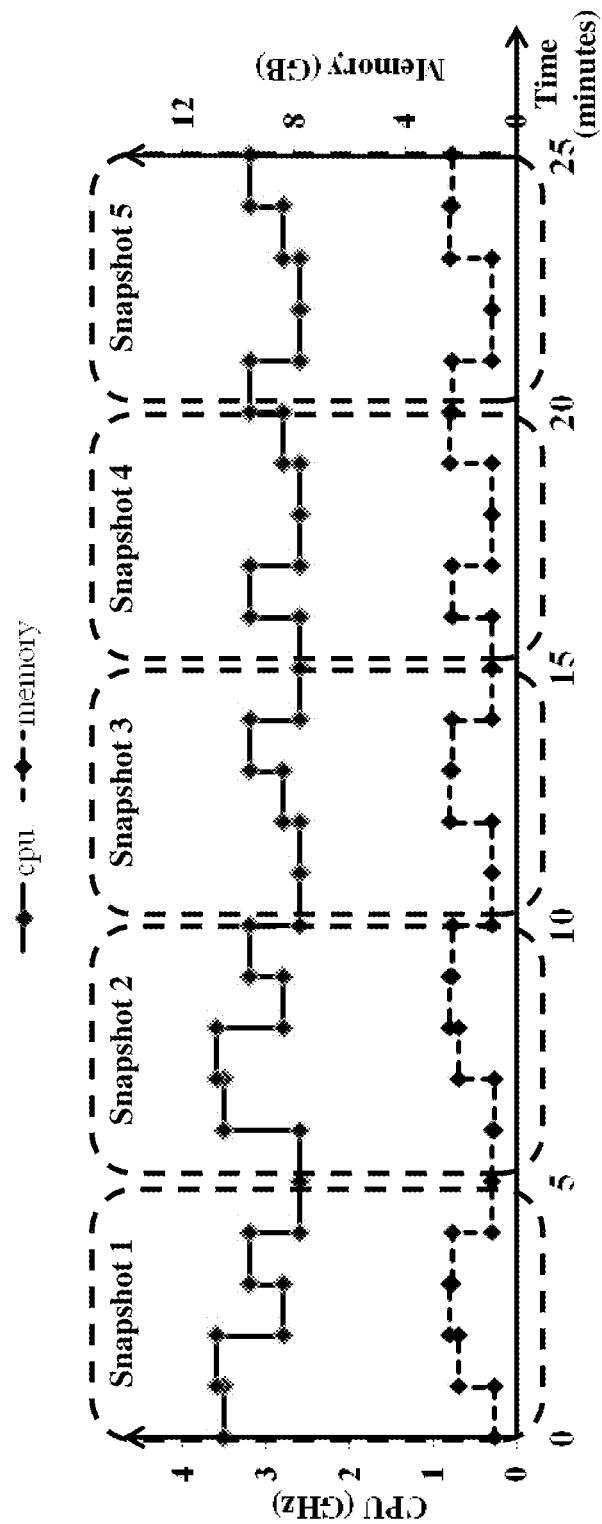
FIG. 6 shows a simplified view of resource demands for a single virtual machine extracted from multiple chronological snapshot files for five minute intervals that have been stitched together by a power management analysis module in accordance with an embodiment of the invention.

The stitching unit 408 operates to stitch or combine the extracted resource demands in chronological order to get resource demands for the entire period of time being analyzed with respect to power management. The stitching of the extracted resource demands for multiple snapshots is needed because performing a power management analysis for each snapshot may modify history, and thus, power management analyses on subsequent snapshots may not be relevant. FIG. 6 shows a simplified view of resource demands for a single VM extracted from multiple chronological snapshot files for five minute intervals that have been stitched together by the stitching unit. In this example, VM resource demands for twenty-five minutes have been extracted from five snapshot files. However, in practice, an arbitrarily large collection of snapshot files may be logically stitched together into a large workload trace. As illustrated in FIG. 6, the demand data can be extracted as a large square wave consisting of many piecewise constant functions. Assuming each snapshot file contains one-minute resource demand information for a five-minute interval, for a week's worth of demand data, 2016 snapshot files must be processed (7(days)*24(hours)*12(snapshots/hour)), containing 10080 demand samples.

The power management simulator 410 operates to construct modeling scenarios from the snapshots of the distributed computer system to simulate the operation of the distributed computer system with the power management module enabled using the demand trace. Each modeling scenario can be constructed with a description of the inventory of the distributed computer system, e.g., host computers, VMs, datastores and VM disks, and a description of the workload on the distributed computer system or workload model used to represent VM resource demand using the workload trace. The workload may be specified as a combination of piecewise functions that generate data to realize different statistical distributions. For example, this line: workload="cpu normal (1500,500) normal (150,10) mem constant (1024) constant (100) 300" defines the workload of a VM with the following properties:

1. CPU demand follows a normal distribution with $\mu=1500$; $\sigma=10$.
2. CPU demand is updated with samples that follow a normal distribution with $\mu=150$; $\sigma=10$.
3. Memory demand is constant at 1024.
4. This describes a 300 second interval; after that, the workloads repeat.

Once the workloads and modeling scenarios are constructed, the power management simulator runs a test case to collect a baseline set of numbers, such as VM happiness metrics, host utilization percentage numbers and the power consumed by the host computers in the distributed computer system. The simulator test case simulates the behavior of the cluster (or distributed computer system) for the specified period of time and performs the same algorithmic actions—such as collecting statistics, migrating clients—that would be carried out in a real-world system. This allows power-management algorithms to be tested in carefully-constructed, simulated environments with a high degree of fidelity.

The power management simulator 410 then performs various what-if analyses to model hypothetical scenarios in a simulated universe where the power management module had been enabled in the distributed computer system using the constructed modeling scenarios. In one mode of operation, the advance options for the power management module are set at default settings in these analyses. Thus, in this mode of operation, the what-if analyses are performed as if one or more advance options for the power management module are set to default settings. In another mode of operation, the user may provide advance option settings for the power management module so that the power management module would operate in the simulated universe using the user-provided advance option settings. Thus, in this mode of operation, the what-if analyses are performed as if one or more advance options for the power management module are set to user-provided settings. Still in another mode of operation, each possible combination of the advance options for the power management module may be analyzed to methodically search the entire solution space for a sweet-spot where power and cost savings may be maximized at little or a little or no cost to VM happiness. Thus, in this mode of operation, the what-if analyses are performed for every combination of advance option settings for the power management module. The results of these analyses are then used to compute new values for client happiness, host utilization percentage numbers and power used in the distributed computer system.

The power savings computing unit 412 operates to compute the power savings that could have been realized had the power management module been enabled during the time period being analyzed. The power savings computing unit explores various orthogonal dimensions (host utilization and power management aggressiveness are two examples) to compute savings along each. An "orthogonal dimension" as used herein represents a variable whose value can be changed, independently, once the power management module 206 is enabled. Each value along an independent dimension allows additional combinations (or modes) of operation that could each have a material impact on the operation of the whole distributed computer system with respect to client placement, migration, and power usage to be realized. The following are examples of options that can be changed independently.

+Average host utilization in the cluster (for example: "60%+/−10%")
+Power management aggressiveness threshold (provided as a star rating between 1 and 5)
+VmDemandHistorySecsHostOn (How long should VM demand history be observed before making host power-on decisions?)
+VmDemandHistorySecsHostOff (How long should VM demand history be observed before making host power-off decisions?)
+VmDemandHistoryNumStdDevAboveAve (This option is used to decide how aggressively the demand for the period of observation must be computed)
+EnablePowerPerformance (Whether or not to perform advanced Cost/Benefit analysis while making power management recommendations)
+PowerPerformanceHistorySecs (How long should VM demand history be observed and those observations used while performing power management Cost/Benefit analyses?)
+PowerPerformanceVmDemandHistoryNumStdDev (This option is used to decide how aggressively the demand for the period of observation must be computed for power management Cost/Benefit analyses)
+MinPoweredOnCpuCapacity (The minimum compute capacity—measured in MHz—that must be kept available through all the powered-on hosts—that is, hosts in the cluster that are not in standby mode. This provides a floor below which the powered-on compute capacity will not be allowed to fall in the cluster)
+MinPoweredOnMemCapacity (The minimum memory capacity—measured in MB—that must be kept available through all the powered-on hosts—that is, hosts in the cluster that are not in standby mode. This provides a floor below which the powered-on memory capacity will not be allowed to fall in the cluster)
+HostsMinUptimeSecs (The minimum number of seconds a host must remain powered-on before it is considered a candidate for being put into standby mode)

The power savings are computed by the power savings computing unit 412 by comparing the new values for client (e.g., VM) happiness, extent of resource clipping, host utilization percentage numbers (including number of host computers powered on/off) and power used in the distributed computer system, which were determined during the simulation, to the baseline numbers.

Based on the computed power savings, the power savings computing unit 412 can provide various information regarding the power management module to the user. For example, the power savings computing unit may provide the following information.

1. Will enabling the power management module save power in the target distributed computer system?
2. How much power will enabling the power management module save, based on the historical data of the target distributed computer system?
3. Based on the user-provided preference for host utilization percentage numbers and aggressiveness thresholds, which settings of the power management module are right for the target distributed computer system?

This power management information is then transmitted back to the management computer of the target distributed computer system to be presented to the user requesting the analyses. Thus, the user can readily determine the efficacy of the power management module in the user's distributed computer system and receive customized recommendations on the exact settings of the power management module for the user's distributed computer system.

In an embodiment, the power management analysis module 106 operates to prevent a state where client demands are clipped, i.e., available resource to clients are below their demands for that resource. In order to prevent any such state, the power management analysis module measures the amount of resources that each client (e.g., VM) will receive from the resource allocation module and does not recommend any settings that would cause power savings at the cost of client (e.g., VM) happiness.

In an embodiment, the power management analysis module 106 may allow a user to explore states where client demands are clipped. There may be some users that might be willing to suffer some small clipping of their clients' demands if it meant that there could be large savings in overall power consumed. For these users, the power management analysis module measures the amount of resources that each client (e.g., VM) will receive from the resource allocation module and does recommend settings that would cause power savings at the cost of client (e.g., VM) happiness. Thresholds may be used to balance power savings and the cost of client happiness.

Figure 7:
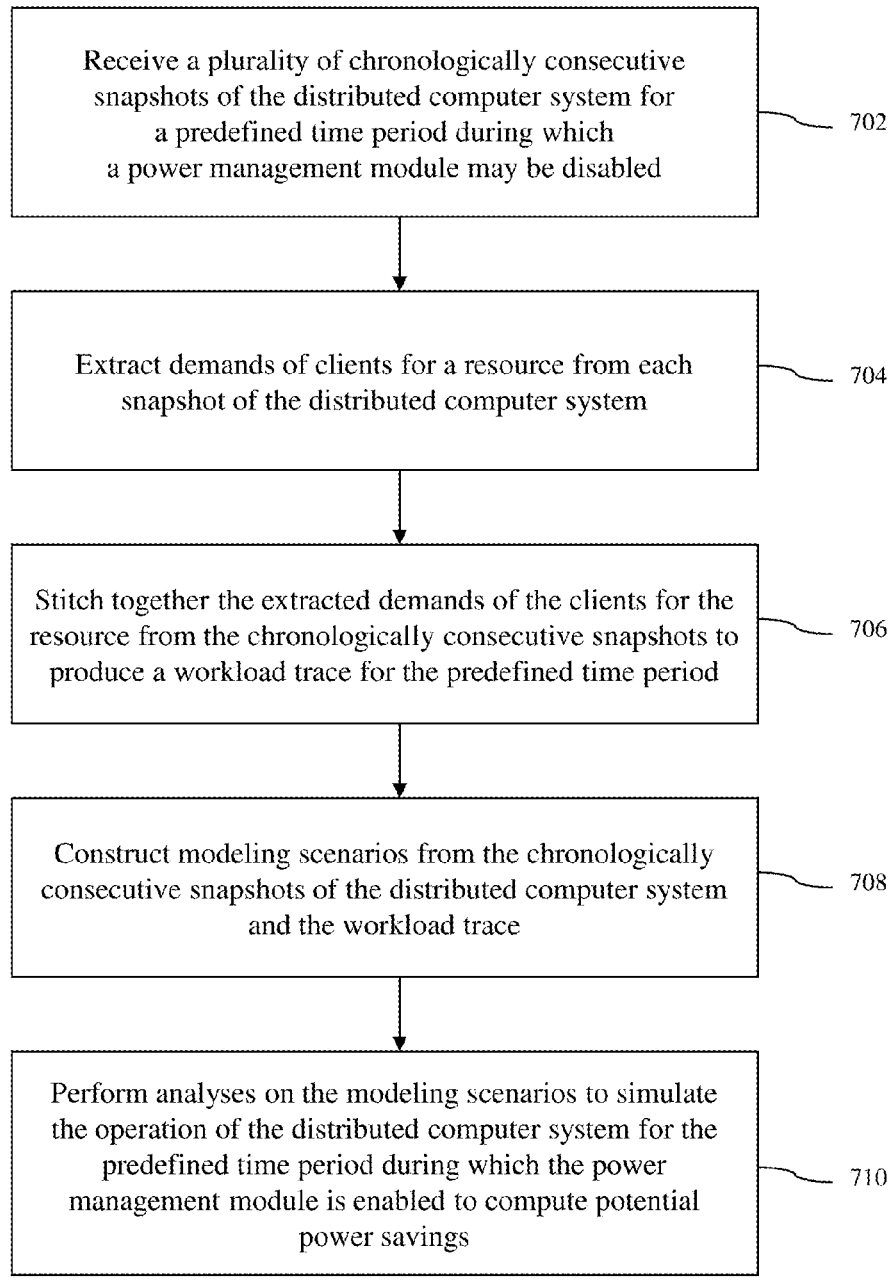
FIG. 7 is a flow chart diagram of a method for performing a hypothetical power management analysis on a distributed computer system in accordance with an embodiment of the invention.

A method for performing a hypothetical power management analysis on a distributed computer system in accordance with an embodiment of the invention is described with reference to a flow diagram of FIG. 7. At block 702, a plurality of chronologically consecutive snapshots of the distributed computer system for a predefined time period during which a power management module may be disabled is received. Each snapshot contains information regarding at least resource usage of clients running in the distributed computer system during a specified time interval of the predefined time period. At block 704, demands of the clients for a resource is extracted from each snapshot of the distributed computer system. At block 706, the extracted demands of the clients for the resource from the chronologically consecutive snapshots are stitched together to produce a workload trace for the predefined time period. At block 708, modeling scenarios are constructed from the chronologically consecutive snapshots of the distributed computer system. At block 710, analyses are performed on the modeling scenarios using the workload trace to simulate the operation of the distributed computer system for the predefined time period during which the power management module is enabled to compute potential power savings.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blue-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for performing a hypothetical power management analysis on a distributed computer system, the method comprising:

receiving a plurality of chronologically consecutive snapshots of the distributed computer system for a predefined time period during which a power management module may be disabled, each snapshot containing information regarding at least resource usage of clients running in the distributed computer system during a specified time interval of the predefined time period;

extracting demands of the clients for a resource from each snapshot of the distributed computer system;

stitching together the extracted demands of the clients for the resource from the chronologically consecutive snapshots to produce a workload trace for the predefined time period;

constructing modeling scenarios from the chronologically consecutive snapshots of the distributed computer system and the workload trace; and performing analyses on the modeling scenarios to simulate the operation of the distributed computer system for the predefined time period during which the power management module is enabled to compute potential power savings.

2. The method of claim 1, wherein the performing the analyses includes performing the analyses on the modeling scenarios as if one or more options for the power management modules are set to default settings.

3. The method of claim 1, wherein the performing the analyses includes performing the analyses on the modeling scenarios as if one or more options for the power management modules are set to user-provided settings.

4. The method of claim 1, wherein the performing the analyses includes performing the analyses on the modeling scenarios as if a particular option for the power management modules is set to a first setting and also performing the analyses on the modeling scenarios as if the particular option for the power management modules is set to a second setting.

5. The method of claim 1, wherein the clients running in the distributed computer system are virtual machines running in the distributed computer system.

6. The method of claim 5, wherein the resource is one of CPU resource and memory resource of a host computer on which the virtual machines running.

7. The method of claim 1, wherein the modeling scenarios include a description of the inventory of the distributed computer system and a description of workload on the distributed computer system.

8. The method of claim 7, wherein the inventory of the distributed computer system includes host computers, virtual machines, datastores and virtual machine disks.

9. The method of claim 1, further comprising computing the amount of power that would have been saved in the distributed computer system during the predefined time period had the power management module been enabled based on results of the analyses on the modeling scenarios.

10. The method of claim 1, further comprising computing one or more option settings for the power management module for the distributed computer system based on a user-provided preference.

11. A computer-readable storage medium containing program instructions for performing a hypothetical power management analyses on a distributed computer system, wherein execution of the program instructions by one or more processors causes the one or more processors to perform steps comprising:
  receiving a plurality of chronologically consecutive snapshots of the distributed computer system for a predefined time period during which a power management module may be disabled, each snapshot containing information regarding at least resource usage of clients running in the distributed computer system during a specified time interval of the predefined time period;
  extracting demands of the clients for a resource from each snapshot of the distributed computer system;
  stitching together the extracted demands of the clients for the resource from the chronologically consecutive snapshots to produce a workload trace for the predefined time period;
  constructing modeling scenarios from the chronologically consecutive snapshots of the distributed computer system and the workload trace; and
  performing analyses on the modeling scenarios to simulate the operation of the distributed computer system for the predefined time period during which the power management module is enabled to compute potential power savings.

12. The computer-readable storage medium of claim 11, wherein the performing the analyses includes performing the analyses on the modeling scenarios as if one or more options for the power management modules are set to default settings.

13. The computer-readable storage medium of claim 11, wherein the performing the analyses includes performing the analyses on the modeling scenarios as if one or more options for the power management modules are set to user-provided settings.

14. The computer-readable storage medium of claim 11, wherein the performing the analyses includes performing the analyses on the modeling scenarios as if a particular option for the power management modules is set to a first setting and also performing the analyses on the modeling scenarios as if the particular option for the power management modules is set to a second setting.

15. The computer-readable storage medium of claim 11, wherein the clients running in the distributed computer system are virtual machines running in the distributed computer system.

16. The computer-readable storage medium of claim 15, wherein the resource is one of CPU resource and memory resource of a host computer on which the virtual machines running.

17. The computer-readable storage medium of claim 11, wherein the modeling scenarios include a description of the inventory of the distributed computer system and a description of workload on the distributed computer system.

18. The computer-readable storage medium of claim 17, wherein the inventory of the distributed computer system includes host computers, virtual machines, datastores and virtual machine disks.

19. The computer-readable storage medium of claim 11, wherein the method further comprises computing the amount of power that would have been saved in the distributed computer system during the predefined time period had the power management module been enabled based on results of the analyses on the modeling scenarios.

20. The computer-readable storage medium of claim 11, wherein the method further comprises computing one or more option settings for the power management module for the distributed computer system based on a user-provided preference.

21. A computer system comprising:
  at least one processor; and
  a power management analysis module operably connected to the at least one processor, the power management analysis module including:
    an access interface unit configured to receive a plurality of chronologically consecutive snapshots of a distributed computer system for a predefined time period during which a power management module may be disabled, each snapshot containing information regarding at least resource usage of clients running in the distributed computer system during a specified time interval of the predefined time period;
    a resource demand extracting unit is configured to extract demands of the clients for a resource from each snapshot of the distributed computer system;
    a stitching unit configured to stitch together the extracted demands of the clients for the resource from the chronologically consecutive snapshots to produce a workload trace for the predefined time period; and
    a power management simulator configured to construct modeling scenarios from the chronologically consecutive snapshots of the distributed computer system and the workload trace, and to perform performing analyses on the modeling scenarios to simulate the operation of the distributed computer system for the predefined time period during which the power management module is enabled to compute to compute potential power savings.

22. The computer system of claim 21, wherein the power management simulator is configured to perform the analyses on the modeling scenarios as if one or more options for the power management modules are set to default settings.

23. The computer system of claim 21, wherein the power management simulator is configured to perform the analyses on the modeling scenarios as if one or more options for the power management modules are set to user-provided settings.

24. The computer system of claim 21, wherein the power management simulator is configured to perform the analyses on the modeling scenarios as if a particular option for the power management modules is set to a first setting and also performing the analyses on the modeling scenarios as if the particular option for the power management modules is set to a second setting.

25. The computer system of claim 21, wherein the clients running in the distributed computer system are virtual machines running in the distributed computer system.

26. The computer system of claim 25, wherein the resource is one of CPU resource and memory resource of a host computer on which the virtual machines running.

27. The computer system of claim 21, wherein the modeling scenarios include a description of the inventory of the distributed computer system and a description of workload on the distributed computer system.

28. The computer system of claim 27, wherein the inventory of the distributed computer system includes host computers, virtual machines, datastores and virtual machine disks.

29. The computer system of claim 21, further comprising a power savings computing unit configured to compute the amount of power that would have been saved in the distributed computer system during the predefined time period had the power management module been enabled based on results of the analyses on the modeling scenarios.

30. The computer system of claim 21, wherein the power management simulator is further configured to compute one or more option settings for the power management module for the distributed computer system based on a user-provided preference.

* * * * *